United States Patent
Itatani et al.

(10) Patent No.: US 6,630,064 B1
(45) Date of Patent: Oct. 7, 2003

(54) COMPOSITION FOR ELECTRODEPOSITION OF POLYIMIDES AND METHOD FOR PRODUCING PATTERNED POLYIMIDE MEMBRANES USING THE SAME

(75) Inventors: Hiroshi Itatani, Yokohama (JP); Shunichi Matsumoto, Kamakura (JP)

(73) Assignee: PI R&D Co., Ltd., Yokohama (JP)

( * ) Notice: Subject to any disclaimer, the term of this patent is extended or adjusted under 35 U.S.C. 154(b) by 73 days.

(21) Appl. No.: 09/806,450

(22) PCT Filed: Aug. 7, 2000

(86) PCT No.: PCT/JP00/05285

§ 371 (c)(1),
(2), (4) Date: Mar. 30, 2001

(87) PCT Pub. No.: WO01/10964

PCT Pub. Date: Feb. 15, 2001

(30) Foreign Application Priority Data

Aug. 6, 1999 (JP) ............................................. 11/256143

(51) Int. Cl.[7] ............................................. C25D 13/04
(52) U.S. Cl. ........................................ 204/489; 205/317
(58) Field of Search ......................... 204/489; 205/317; 528/184

(56) References Cited

U.S. PATENT DOCUMENTS

| | | | |
|---|---|---|---|
| 5,202,411 A | 4/1993 | Itatani et al. | |
| 5,502,143 A | 3/1996 | Oie et al. | |
| 5,741,599 A | 4/1998 | Oie et al. | |

FOREIGN PATENT DOCUMENTS

EP 1024407 A1 8/2000

OTHER PUBLICATIONS

Yamaoka et al. Polyfile 2, "Review of Current Status of Development of Photosensitive Polyimides"; pp. 14–18 (1990).

*Primary Examiner*—Kishor Mayekar
(74) *Attorney, Agent, or Firm*—Birch, Stewart, Kolasch & Birch, LLP

(57) ABSTRACT

A composition for electro-depositing polyimide membranes which can be patterned by photolithography, which are excellent in heat resistance, insulation performance and in chemical resistance. The composition for electrodeposition of polyimides according to the present invention comprises a composition for electrodeposition of polyimides comprising a photoacid generator, a positive-type photosensitive polyimide having oxycarbonyl groups in side chains, a polar solvent which dissolves said polyimide, water, a dispersing agent, and an alkaline neutralizer.

5 Claims, No Drawings

COMPOSITION FOR ELECTRODEPOSITION OF POLYIMIDES AND METHOD FOR PRODUCING PATTERNED POLYIMIDE MEMBRANES USING THE SAME

This application is the national phase under 35 U.S.C. §371 of PCT International Application No. PCT/JP00/05285 which has an International filing date of Aug. 7, 2000 which designated the United States of America.

TECHNICAL FIELD

The present invention relates to a composition for electrodeposition of polyimides and method for producing patterned polyimide membranes using the same. Since the electro-deposited polyimide membranes prepared by the method of the present invention are excellent in heat resistance, insulation performance, mechanical properties and chemical resistance, they are utilized in electric or electronic parts, airplanes, cars, semiconductors and their peripheral circuits.

BACKGROUND ART

Polyimides are excellent in heat resistance, electric insulation performance, mechanical properties, chemical resistance and the like, so that they are widely used in electric and electronic parts, airplane parts, car parts, peripheral circuits of semiconductors and the like.

Since conventional polyimides represented by Kapton are insoluble in solvents, the methods in which polyamic acids that are precursors of polyimides are made into films or molded products and then the resulting products are heated at 250° C. to 350° C. to imidize the polyamic acids to polyimides, are widely employed.

Polyimides having specific compositions are soluble in phenolic solvents, and polyimide block copolymers having various added functions have been synthesized by sequential reactions (U.S. Pat. No. 5,202,411). However, phenolic solvents have bad smell and are corrosive, so that countermeasures are necessary for environmental protection.

Polyimides free from the above-mentioned drawbacks, which are soluble in ordinary polar solvents such as N-methylpyrrolidone, dimethylformamide, dimethylacetamide, tetramethylurea and sulfolane were discovered by the present applicant et al (U.S. Pat. No. 5,502,143). According to this, tetracarboxylic dianhydride and aromatic diamine are heated at 160° C. to 180° C. in the presence of a lactone-base composite catalyst to directly produce a polyimide. Since this polyimide solution is not decomposed by water, its stability is good. Further, since the imidizing treatment at 250° C. to 350° C. is not necessary, polyimide products having excellent processabilities are obtained by removing the solvent at a temperature not higher than 200° C.

Polyimides are also used as photoresists. Conventional photoresists are negative-type polyimide photoresists comprising acrylic esters of polyarnic acids with which the portions irradiated with light are solidified by radical polymerization and the non-irradiated portions are removed by development with an alkali. Negative-type polyimide photoresists have drawbacks in that the sensitivity is lower than that of positive-type polyimide photoresists, and that loss of membrane is large (Ao Yamaoka et al.; Polyfile 2, 14(1990)).

Soluble polyimide photoresists which exhibit positive photosensitivity in the presence of photoacid generators have been discovered by the present applicant (WO99/19771).

As the methods for coating polyimides, immersion method, spray method, roll coating method, spin coating method and the like are widely employed. As the method for coating thin membranes, spin coating method is used, but this method has a drawback in that loss of material is large. By employing electrodeposition method, uniform thin membranes are obtained irrespective of the shapes of the surfaces to be coated, and insulative thin membranes are easily obtained. From this point of view, a method for forming polyimide thin membranes by anion electrodeposition method using soluble polyimide having oxycarbonyl groups was discovered by co-inventors of the present invention (U.S. Pat. No. 5,741,599).

DISCLOSURE OF THE INVENTION

However, a technique by which the polyimide membrane after electrodeposition is patterned by photolithography is not known.

Accordingly, an object of the present invention is to provide a composition for electrodeposition of polyimides, by which the polyimide membrane formed by electrodeposition can be patterned by photolithography, and to provide a method for forming patterned polyimide membranes using the same.

The present inventors intensively studied to discover that by making the composition for electrodeposition contain a photoacid generator, a positive-type photosensitive polyimide having oxycarbonyl groups in side chains, a polar solvent which dissolves said polyimide, water, a dispersing agent, and an alkaline neutralizer, not only the polyimide can be electro-deposited, but also the deposited polyimide membrane can be patterned by photolithography, to complete the present invention.

That is, the present invention provides a composition for electrodeposition of polyimides comprising a photoacid generator, a positive-type photosensitive polyimide having oxycarbonyl groups in side chains, a polar solvent which dissolves said polyimide, water, a dispersing agent, and an alkaline neutralizer. The present invention also provides a method for electrodeposition of polyimides, comprising immersing an electric conductor in said composition according to the present invention, and flowing electric current therein to deposit polyimide membrane on said electric conductor which is an anode. The present invention also provides a method for producing a patterned electrodeposited polyimide membrane, comprising irradiating said polyimide membrane electro-deposited by the method according to the present invention with a light through a mask pattern, and forming a positive image by development with an alkali.

According to the present invention, coated polyimide thin membranes which are smooth and excellent in insulation performance can be obtained by electrodeposition of polyimides which are excellent in heat resistance, insulation performance and chemical resistance. Further, by irradiating the coated polyimide thin membrane with a light, positive-type fine images can be formed. Thus, since fine pattern images made of polyimide thin membranes can be formed on copperplated printed circuit boards, the method is useful for forming circuits in semiconductors and peripheries thereof.

BEST MODE FOR CARRYING OUT THE INVENTION

As mentioned above, the composition for electrodeposition according to the present invention comprises a positive-type photosensitive polyimide having oxycarbonyl groups in its side chains. Here, the term "oxycarbonyl group" means a group which gives free —COO⁻group in the composition for electrodeposition, and carboxyl group (—COOH) is preferred. By virtue of the oxycarbonyl group, electrodeposition can be attained.

The polyimide is synthesized by polycondensation between one or more tetracarboxylic dianhydrides and one or more diamines. The oxycarbonyl groups existing in the side chains of the polyimide may exist in either the tetracarboxylic dianhydride or the diamine, and the oxycarbonyl group preferably exists in the diamine.

The proportion (acid equivalent) of the oxycarbonyl groups existing in the polyimide is not restricted, and the acid equivalent (gram of the polyimide/COOH) may preferably be about 500 to 5000, more preferably about 700 to 3000.

As the tetracarboxylic dianhydride constituting the polyimide, aromatic tetracarboxylic dianhydrides are preferred in view of heat resistance. Preferred examples of the aromatic tetracarboxylic dianhydride (described in the form of monomer) include pyromellitic dianhydride (1,2,3,4-benzenetetracarboxylic dianhydride), 3,4,3',4'-biphenyltetracarboxylic dianhydride, 3,4,3',4'-benzophenonetetracarboxylic dianhydride, 2,3,2',3'-benzophenonetetracarboxylic dianhydride, 2,3,3',4'-biphenyltetracarboxylic dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(2,3-dicarboxyphenyl) ether dianhydride, bis(3,4-dicarboxyphenyl)sulfone dianhydride, bis(2,3-dicarboxyphenyl)sulfone dianhydride, 4,4'-{2,2,2-trifluoro-1-(trifluoromethyl)ethylidene}bis(1,2-benzenedicarboxylic dianhydride), 9,9-bis{4-(3,4-dicarboxyphenoxy)phenyl}fluorene dianhydride, 1,2,5,6-naphthalenetetracarboxylic dianhydride, 2,3,6,7-naphthalenetetracarboxylic dianhydride, 1,4,5,8-naphthalenetetracarboxylic dianhydride, 3,4,9,10-perylenetetracarboxylic dianhydride, 2,3,5,6-pyridinetetracarboxylic dianhydride, and bicyclo(2,2,2)-oct-7-ene-2,3,5,6-tetracarboxylic dianhydride. It should be noted that since naphthalenetetracarboxylic dianhydride and pyromellitic dianhydride yield insoluble polyimides, the amounts of these compounds are preferably small, and the amount of each of these compounds is preferably not more than 15 mol %.

As the diamine having the oxycarbonyl group, diaminocarboxylic acids are preferred. As the diaminocarboxylic acids, diaminobenzoic acids such as 3,5-diaminobenzoic acid and 2,4-diaminobenzoic acid are preferred.

Although the amount of these diamines is not restricted, the amount of these diamines in the total diamine components may preferably be about 70 to 20 mol %, more preferably about 50 to 25 mol %.

To improve the photosensitivity of the polyimide, it is preferred to use a diamine having at least one selected from the group consisting of carbonyl group, ether group, sulfide group, disulfide group and sulfonyl group in the main chain of the molecule thereof, and/or a diamine having at least one selected from the group consisting of alkoxy group, hydroxy group, nitro group and sulfonyl group in the side chain thereof, in addition to the above-mentioned diamine having the oxycarbonyl group.

The diamine component is preferably an aromatic diamine in view of heat resistance. Preferred examples of the diamine having at least one selected from the group consisting of carbonyl group, ether group, sulfide group, disulfide group and sulfonyl group in the main chain of the molecule thereof (described in the form of monomer) include aromatic diamines such as 4,4'- (or 3,4'-, 3,3'-, or 2,4'-)diaminodiphenyl ether, 4,4'-(or 3,3'-)diaminodiphenyl sulfone, 4,4'-(or 3,3'-)diaminodiphenyl sulfide, 4,4'-benzophenonediamine, 3,3'-benzophenonediamine, 4,4'-di(4-aminophenoxy)phenyl sulfone, 4,4'-di(3-aminophenoxy) phenyl sulfone, 4,4'-bis(4-aminophenoxy)biphenyl, 1,4-bis (4-aminophenoxy)benzene, 1,3-bis(4-aminophenoxy) benzene, 2,2-bis{4-(4-aminophenoxy)phenyl}propane, 3,3', 5,5'-tetramethyl-4,4'-diaminodiphenylmethane, 4,4'-di(3-aminophenoxy)phenyl sulfone, 2,2'-bis(4-aminophenyl) propane, 2,2'-trifluoromethyl-4,4'-diaminobiphenyl, 2,2',6, 6'-tetramethyl-4,4'-diaminobiphenyl, 2,2',6,6'-tetratrifluoromethyl-4,4'-diaminobiphenyl, bis{(4-aminophenyl)-2-propyl}1,4-benzene, 9,9-bis(4-aminophenyl)fluorene and 9,9-bis(4-aminophenoxyphenyl) fluorene; diamines such as 2,6-diaminopyridine, 2,4-diaminopyridine, bis(4-aminophenyl-2-propyl)-1,4-benzene and diaminopolysiloxane compounds.

Preferred examples of the aromatic diamine having at least one selected from the group consisting of alkoxy group, hydroxy group, nitro group and sulfonyl group in the side chain thereof (described in the form of monomer) include 2-nitro-1,4-diaminobenzene, 3,3'-dinitro-4,4'-diaminobiphenyl, 3,3'-dimethoxy-4,4'-diaminobiphenyl, 3,3'-dihydroxy-4,4'-diaminobiphenyl, 2,4-diaminophenol and otolidine sulfone.

As the diamine component, diamine(s) other than mentioned above may also be further used. Examples of such a diamine (described in the form of monomer) include 1,3-diaminobenzene, 1,4-diaminobenzene, 2,4-diaminotoluene, 3,3'-dimethyl-4,4'-diaminobiphenyl 2,2-bis(trifluoro)-methylbenzidine, 2,2-bis(4-aminophenyl)propane, 1,1,1,3, 3,3-hexafluoro-2-bis(4-aminophenyl)propane, 4,4'-diaminodiphenylmethane, 1,5-diaminonaphthalene and 9,10-bis(4-aminophenyl)anthracene. The amount of these diamine components is usually about 80 to 30 mol %, preferably about 75 to 50 mol % based on the total diamine components.

The polyimide contained in the composition of the present invention is solvent soluble. Here, the term "solvent soluble" means that the polyimide is dissolved in N-methyl-2-pyrrolidone (NMP) to a concentration of not less than 5% by weight, preferably not less than 10% by weight.

The weight average molecular weight of the polyimide contained in the composition according to the present invention is preferably not less than 25,000, more preferably 30,000 to 400,000 in terms of polystyrene. If the weight average molecular weight is within this range, good solvent solubility, membrane-forming property, membrane strength and insulation performance may be obtained. In addition to attaining the molecular weight described above, the polyimide preferably has a thermal decomposition initiation temperature of not lower than 450° C., and a glass transition point of not lower than 250° C. in view of heat resistance.

The polyimide in the composition according to the present invention may be produced by direct imidization reaction between the diamine and the aromatic tetracarboxylic dianhydride.

The direct irmidation reaction between the aromatic diamine and the aromatic tetracarboxylic dianhydride may be carried out using a catalytic system utilizing the following equilibrium redaction between a lactone, base and water.

{lactone}+{base}+{water}={acid}⁺{base}⁻

A polyimide solution may be obtained by using the {acid}⁺{base}⁻ system as a catalyst and heating the reaction mixture at 150° C. to 220° C., preferably 160° C. to 180° C. The water produced by the imidation reaction is eliminated from the reaction system by azeotropic distillation with toluene. When the imidation in the reaction system is completed, {acid}⁺{base}⁻ is converted to the lactone and the base, and they lose the catalytic activity and are removed from the reaction system with the toluene. The polyimide solution produced by this process can be industrially used as it is as a polyimide solution with high purity because the above-mentioned catalytic substances are not contained in the polyimide solution after the reaction.

Examples of the reaction solvent which may be used in the above-mentioned imidation reaction include, in addition to the above-mentioned toluene, N,N-dimethylformamide, N,N-dimethylmethoxyacetamide, N,N-dimethylethoxyacetamide, N-methyl-2-pyrrolidone, N-methylcaprolactam, dimethylsulfoxide, dimethylsulfolane, tetramethylurea and the like. These organic solvents may be used individually or in combination. In the above-mentioned polycondensation reaction, the concentration of the reaction materials is usually 5 to 40% by weight, preferably 10 to 30% by weight.

As the lactone, γ-valerolactone is preferred. As the base, pyridine and/or methylmorpholine is(are) preferred.

The mixing ratio (acid/diamine) between the aromatic acid dianhydride and the aromatic diamine subjected to the imidation reaction is preferably about 1.05 to 0.95 in terms of molar ratio. Further, the concentration of the acid dianhydride based on the total reaction mixture is preferably about 4 to 16% by weight, the concentration of the lactone is preferably about 0.4 to 1.6% by weight, the concentration of the base is preferably about 0.8 to 3.2% by weight, and the concentration of the toluene is preferably about 6 to 15% by weight at the initiation of the reaction. The lactone is preferably used in an amount of 0.05 to 0.3 mole with respect to the acid dianhydride (U.S. Pat. No. 5,502,143). The reaction time is not restricted and varies depending on the molecular weight of the polyimide to be produced and the like, and usually about 2 to 10 hours. It is preferred to carry out the reaction under stirring.

By carrying out the above-described imidation reaction sequentially in two steps using different acid dianhydrides and/or different diamines, polyimide block copolymers can be produced. By the conventional process for producing polyimide through polyamic acid, only random copolymers can be produced as copolymers. Since polyimide block copolymers can be produced selecting arbitrary acids and/or diamines, desired properties or functions such as high light transmittance, high resolution, good adhesiveness to the substrate, good development by alkali, high resistance to dry etching and the like can be given to the polyimide. In the composition of the present invention, such a polyimide copolymer may also be employed.

A preferred process for producing the polyimide block copolymers include the process wherein a polyimide oligomer is produced using the acid catalyst generated by the above-described lactone and the base, and using either one of the aromatic diamine component or the tetracarboxylic dianhydride in excess, and then the aromatic diamine and/or the tetracarboxylic dianhydride is(are) added (the molar ratio of the total aromatic diamines to the total tetracarboxylic dianhydride is 1.05 to 0.95), thereby carrying out two-step polycondensation.

That is, in the synthesis of the polyimide block copolymer according to the present invention, a tetracarboxylic dianhydride (A1) and an aromatic diamine (B1) are mixed and heated in a solvent to prepare a polyimide oligomer. Then a tetracarboxylic dianhydride (A2) and/or an aromatic diamine (B2) are added. By heating the mixture to polycondense the materials, a polyimide block copolymer {(A1–B1)$_m$-(A2–B2)$_n$}$_p$ (wherein m, n and p represent integers) in which the molar ratio of the total tetracarboxylic dianhydrides (A1+A2) to the total aromatic diamines (B1+B2) is 1.05 to 0.95 can be obtained. Here, it is necessary to select the combination by which the produced polyimide copolymer is soluble in the solution and does not precipitate. In view of this, 6FDA (4,4'-{2,2,2-trifluoro-1-(trifluoromethyl)ethylidene}bis(1,2-benzenedicarboxylic dianhydride)) and BPDA (3,3',4,4'-biphenyltetracarboxylic dianhydride) are useful acid dianhydrides. On the other hand, pyromellitic dianhydride often yields insoluble polyimide copolymer.

Polyimide block copolymers have an advantage that the properties may be improved while retaining the properties of the polyimides. That is, polyimide block copolymers have an advantage that improvement of the properties, such as increasing adhesiveness, dimensional stability, chemical resistance, photosensitivity and the like, may be attained by using easily available materials which are industrially produced.

The polyimide solution thus prepared have good stability in storage. In a closed container, it can be stored stably at room temperature for several months to several years.

The thus prepared polyimide solution may be diluted with a diluent. Examples of the diluent include dioxane, dioxolane, γ-butyrolactone, cyclohexanone, propylene glycol monomethyl ether acetate, methyl lactate, anisole and ethyl acetate, although the diluent is not restricted to these.

The content of the polyimide in the composition for electrodeposition according to the present invention is not restricted, and may preferably be about 3 to 15% by weight.

As the photoacid generator contained in the composition according to the present invention, the following may be employed. Examples of the photosensitive quinone diazide compounds include esters of 1,2-naphthoquinone-2-diazide-5-sulfonic acid and 1,2-naphthoquinone-2-diazide-4-sulfonic acid, the counterparts of the esters being low molecular aromatic hydroxyl compounds such as 2,3,4-trihydroxybenzophenone, 1,3,5-trihydroxybenzene, 2- and 4-methylphenol and 4,4'-hydroxy-propane. The photosensitive quinone diazide compound may be added in an amount of 0.05 to 0.3 based on the weight of the polyimide resin.

Examples of the onium salts include aryl diazonium salts such as 4(N-phenyl)aminophenyl diazonium salt; diaryl halonium salts such as diphenyl iodonium salt; triphenyl sulfonium salts such as bis{4-(diphenylsulfonio)phenyl}sulfide, and bis-hexafluoroantimonate. The onium salts may be added in an amount of 0.05 to 0.3 based on the weight of the polyimide resin.

The composition for electrodeposition according to the present invention comprises a polar solvent which dissolve the above-described polyimide. As the polar solvent, the above-mentioned polar solvent (and the diluent if a diluent is used) used in the polycondensation step of the polyimide may be used as it is. Thus, the composition for electrodeposition according to the present invention may be prepared by adding other components to the polyimide solution obtained as mentioned above. Although the content of the polar solvent in the composition for electrodeposition is not restricted, it is usually about 10 to 40% by weight, preferably about 20 to 30% by weight.

The composition for electrodeposition according to the present invention comprises water. The content of water in the composition for electrodeposition is not restricted, and it is usually abqut 15 to 60% by weight, preferably about 20 to 40% by weight.

The composition for electrodeposition according to the present invention further comprises a dispersing agent. As the dispersing agent, solvents in which the solubility of the polyimide is small (the solubility is preferably not more than 5%, more preferably not more than 3%) are preferred, and at least one selected from the group consisting of alcohols, esters, lactones, ethers, ketones and hydrocarbons is preferred. Examples of such a dispersing agent include alcoholic compounds (e.g., benzyl alcohol, furfuryl alcohol, diacetone alcohol, methylcellosolve and cyclohexyl alcohol), ester compounds (e.g., methyl benzoate, isobutyl benzoate and butyl benzoate), lactone compounds (e.g., γ-butyrolactone), ether compounds (e.g., anisole, tetrahydrofuran and dioxane), ketone compounds (e.g., cyclohexanone, Michler's ketone, acetophenone and butanone), and hydrocarbon compounds (e.g., toluene, xylene and decalin). The content of the dispersing agent in the composition for electrodeposition is not restricted, and is usually about 20 to 60% by weight, preferably 30 to 55% by weight.

The composition for electrodeposition according to the present invention further comprises an alkaline neutralizing agent (base). As the base, any base which can neutralize the oxycarbonyl group (carboxylic acid) on the polyimide may be employed. Preferred examples include amines such as N-dimethylmethanolamine, N-dimethylethanolamine, triethylamine, triethanolamine, N-dimethylbenzylamine and N-methylmorpholine. Among these, N-methylmorpholine and N-dimethylmethanolamine are especially preferred. The content of the alkaline neutralizing agent is not restricted, and is preferably not less than 50 mol %, more preferably 100 to 200 mol % with respect to the stoichiometric amount necessary for neutralizing the composition.

The sensitivity of the pattern resolution may be increased by adding a photosensitizer to the composition for electrodeposition according to the present invention. Although not restricted, examples of the photosensitizer include Michler's ketone, benzoin ether, 2-methylanthraquinone, benzophenone, benzoic acid esters and the like. Using isopropyl benzoate, and/or tertiary butyl benzoate, and/or phenyl benzoate as photosensitizer(s) together with the above-mentioned photoacid generator is effective, which is especially preferred. The content of the photosensitizer is not restricted, and usually, it is preferably about 5 to 15% by weight based on the total composition.

Further, modifiers which are added to the ordinary photosensitive polyimides, such as coupling agents, plasticizers, film-forming resins, surfactants, stabilizers, spectrum sensitivity-adjusters and the like may be added.

By immersing an electric conductor in the composition for electrodeposition according to the present invention and by supplying electric current through the electric conductor as an anode, electro-deposited polyimide membrane can be formed on the electric conductor.

The electric conductor is not restricted, and may be a metal material such as iron, copper, aluminum, stainless steel or the like, or a material whose surface is coated with a plated metal or an anodic oxidation coating.

The method for electrodeposition per se known in the art may be employed as it is. That is, after adjusting the temperature of the polyimide solution for electrodeposition to preferably 15° C. to 35° C., the electric conductor to be coated is immersed, and electric current is supplied by a direct voltage source. The energizing is performed preferably at 20 to 200V for 30 seconds to 5 minutes. By this, an electro-deposited polyimide coating is formed on the material to be coated, which is the anode. The thickness of the electro-deposited polyimide membrane is usually about 0.1 to 50 μm.

Preferably, the polyimide membrane is then washed with water and dried in the air at a temperature not higher than 120° C., preferably at 70 to 100° C., thereby completing the coating with the polyimide. It is preferred to use an infrared heater for this heat treatment. To avoid photolysis of the photoacid generator, the heat treatment is carried out under illumination free from the photosensitizing wavelength.

Thereafter, the photosensitive polyimide layer is subjected to irradiation. Usually, UV light is used, but high energy radiation, such as X-ray, electron beam or high power oscillation beam from an extra-high pressure mercury lamp may be employed. Selective exposure is carried out through a mask, or the surface of the photosensitive polyimide layer may also be directly irradiated with an actinic ray. Examples of the actinic ray include various UVs such as i-line, h-line and g-line of low pressure mercury lamp, light from xenon lamp, and far ultraviolet rays such as excimer laser beams from KrF, ArF or the like, X-ray, electron beam, gamma ray, neutron ray and ion beams.

The polyimide membrane is then optionally heated (baked) at 50° C. to 150° C., preferably 60° C. to 120° C. by heating on a hot plate or in an oven, or by irradiation with infrared light. If the temperature of the heat treatment is lower than 50° C., the acid generated by the photoacid generator may not sufficiently react with the compound having the substituent groups decomposed by the acid. On the other hand, if the temperature is higher than 120° C., the exposed area and the non-exposed area of the polyimide membrane may be excessively decomposed or excessively cured. By the above-mentioned baking, in the exposed area of the polyimide membrane, the acid generated by the exposure acts as a catalyst and reacts with the compound having substituent groups which are decomposed by the acid. That is, the substituent groups on the compound, which groups are decomposed by the acid, are decomposed so that the compound is converted to an alkali-soluble compound. In some cases, by leaving the polyimide membrane at room temperature for a long time, the same effect obtained by the above-mentioned post-baking may be obtained.

The polyimide membrane after baking is then subjected to development with an alkaline developer by immersion method or spray method to selectively dissolving and removing the exposed areas of the polyimide membrane, thereby obtaining the desired pattern. Examples of the alkaline solution used as the developer include inorganic aqueous alkaline solution such as aqueous solutions of sodium hydroxide, sodium carbonate and sodium metasilicate, and organic aqueous alkaline solutions such as aqueous solutions of tetramethylammonium hydroxide, trimethylhydroxyammonium hydroxide and ethanolamine, as well as these aqueous solutions to which one or more alcohols, surfactants or the like are added.

The duration of development varies depending on the exposure energy, strength of the developer, mode of development, pre-drying temperature, the temperature of the developer and the like. In general, in immersion development, the developing time is usually about 2 to 10 minutes, and in spray development, the developing time is usually about 0.5 to 5 minutes. The development is stopped by immersing the membrane in an inactive solvent such as isopropanol or in deionized water, or by spraying such a liquid on the membrane.

The positive-type photosensitive electro-deposited polyimide according to the present invention can form a polyimide coating having a thickness of 0.1 to 50 μm, and relief structures with sharp contours.

Since the positive-type photosensitive polyimide copolymer in the composition for electrodeposition according to the present invention has very high solubility in alkali, the polyimide membrane pattern is free from cracks and jagging, and the pattern is not collapsed. Further, the pattern can be formed with a high reproducibility. In addition, the obtained pattern has a very high resolution. Therefore, by using the polyimide membrane pattern as an etching mask for dry etching, very fine pattern with a size of less than 1 μm can be accurately transcribed to the exposed substrate. One or more steps other than mentioned above may be added without any problems. For example, a step of forming a flat layer used as the bed layer of the polyimide membrane, a pre-treatment step for improving adhesiveness between the polyimide membrane and the bed layer, a rinsing step for removing the developer with water or the like after development, a step of re-irradiation of UV before dry etching and/or the like may be optionally carried out.

Thus, by forming a polyimride membrane on a substrate by electro-depositing the composition for electrodeposition according to the present invention, irradiation of actinic ray (exposure), heating (baking) and by development with an alkali, fine resist pattern with good pattern profile can be formed. In turn, by conducting dry etching on the substrate using the resist pattern as a mask, the pattern can be accurately transcribed to the substrate without sagging or the like of the pattern.

Since the positive-type polyimide copolymer in the composition for electrodeposition according to the present invention is a complete linear polyimide, it is not changed in water or by heating, and its storage stability is good. Therefore, it can be used as photosensitive films. Further, after forming the pattern by development, unlike the polyamic acid molecules, the postbake at 250 to 350° C. is not necessary, and only drying under heat at 150 to 250° C. to evaporate the solvent is carried out. Further, the polyimide membrane after forming the pattern is tough, resistant to high temperature and excellent in mechanical properties.

The resolution and photosensitivity, as well as the heat resistance, chemical resistance and mechanical strength, of the positive-type photosensitive polyimide copolymers for electrodeposition according to the present invention, are variable depending on the molecular weight and the molecular weight distribution. There is a tendency that the larger the molecular weight and the smaller the imide group content, the longer the development time and the dipping time in the alkali solution.

Since the electro-deposited photosensitive polyimide according to the present invention is a complete linear polyimide, it is not changed in water or by heating, and its storage stability is good. After forming the pattern by development, only drying under heat at 150 to 250° C. to evaporate the solvent is sufficient. Further, the polyimide membrane after forming the pattern is tough, resistant to high temperature and excellent in mechanical properties, insulation performance and chemical resistance.

EXAMPLES

The present invention will now be described in detail referring to some examples thereof.

Since characteristic electro-deposited photosensitive polyimide copolymers are obtained by various combinations of acid dianhydrides and aromatic diamines, the present invention is not restricted to these examples.

Example 1

Preparation of Polyimide Block Copolymer Solution

A stainless steel anchor agitator and reflux condenser were attached to a 1-liter three-necked separable flask made of glass, the condenser comprising a trap and a cooling tube having balls and mounted on the trap. The flask was heated under stirring under nitrogen gas flow.

To the flask, 49.6 g (200 mmol) of bicyclo(2,2,2)-oct-7-ene-2,3,5,6-tetracarboxylic dianhydride, 15.22 g (100 mmol) of 3,5-diaminobenzoic acid, 3 g (30 mmol) of γ-valerolactone, 4.8 g (60 mmol) of pyridine, 300 g of N-methylpyrrolidone and 60 g of toluene are added, and the mixture is heated at a silicone bath temperature of 180° C. under stirring at 180 rpm for 1 hour. After the reaction, 30 ml of distillate of toluene and water was removed.

After cooling the mixture in the air, 29.4 g (100 mmol) of 3,4,3',4'-biphenyltetracarboxylic dianhydride, 58.46 g (200 mmol) of bis-(3-aminophenoxy)-1,3-benzene, 268 g of N-methylpyrrolidone and 40 g of toluene were added and the mixture was heated at 180° C. under stirring at 180 rpm for 4 hours and 30 minutes. The polyimide solution after removing the reaction reflux had a concentration of polyimide of 20%.

The thus produced polyimide block copolymer had a most frequent molecular weight M of 53,600, number average molecular weight Mn of 34,900, weight average molecular weight Mw of 57,500, Z average molecular weight Mz of 88,500, the molecular weights being in terms of polystyrene. Mw/Mn=1.65, Mz/Mw=2.54.

Preparation of Coating Composition for Electrodeposition

To 150 g (polyimide block copolymer content: 30 g) of the thus prepared 20% polyimide block copolymer solution (acid equivalent: 1419), 200 g of γ-butyrolactone, 3.4 g of N-methylmorpholine (ratio to amount necessary for neutralization: 200%), 50 g of cyclohexanone, 100 g of anisole, and 9 g of o-cresol ester of 1,2-naphthoquinone-2-diazide-5-sulfonic acid (hereinafter referred to as "NT-200") (30% by weight based on the polyimide block copolymer) as a photoacid generator were added and dissolved.

To this solution, 180 ml of ion-exchanged water was added to prepare a colloidal dispersion (the content of the polyimide block copolymer was 4.3% by weight). The preparation of the solution for electrodeposition was carried out in a dark room.

Electrodeposition Experiment

A constant voltage direct current generator manufactured by TAKASAGO SEISAKUSHO was used.

In a beaker, 200 ml of the above-described aqueous solution for electrolysis was placed and a copper plate as a cathode and a metal plate to be coated having a size of 2 cm×8 cm (copper foil for printed circuit board manufactured by MITSUI KINZOKU KOZAN) as an anode were immersed therein, followed by flowing electric current therebetween, thereby carrying out electrodeposition experiment.

The temperature of the solution was 29° C., the distance between the electrodes was 35 mm, the voltage was 16V and the quantity of electricity was 0.9 coulombs. After completion of energizing, the copper foil coated by electrodeposition was heated to dry for 10 minutes with an infrared drier set at a temperature of 90° C. After this series of treatment, the thickness of the polyimide block copolymer coating on the front surface was 12 µm.

Method for Forming Images

On this photoresist coating layer, a test pattern (through holes and line-and-space pattern having diameters and widths of 10, 15, 20, 25, - - -, and 200 µm, respectively) for positive-type photomask was placed, and the coating layer was irradiated at a dose of exposure of 1000 mJ at which images are obtained using 2 kW extra-high pressure mercury lamp apparatus (JP-2000G, commercial product of Oak Seisakusho).

The coated material after the above-mentioned irradiation was immersed in a developer kept at room temperature. The developer was a mixture of 30 g of aminoethanol, 30 g of N-methylpyrrolidone and 30 g of water.

After immersing the coating layer after the above-mentioned irradiation in this solution for 10 minutes, the resultant was washed with deionized water and dried with an infrared lamp, followed by observation of the resolution. The thickness of the polyimide coating membrane after drying treatment at 90° C. for 30 minutes was about 10µm.

As for the through hole patterns in the coating membrane after the above-mentioned treatments, formation of through holes having sharp and circular sections having a diameter of 15 µm was confirmed. As for the line-and-space pattern, formation of images of lines having a width of 15 µm was confirmed.

Example 2

In the same manner as in Example 1, a solution of polyimide block copolymer with a concentration of 20% was prepared.

Preparation of Polyimide Block Copolymer Solution

To the flask, 29.78 g (120 mmol) of bicyclo(2,2,2)-oct-7-ene-2,3,5,6-tetracarboxylic dianhydride, 9.12 g (60 mmol) of 3,5-diaminobenzoic acid, 2.4 g (24 mmol) of γ-valerolactone, 3.9 g (48 mmol) of pyridine, 216 g of N-methylpyrrolidone and 30 g of toluene were added, and the mixture was heated at a silicone bath temperature of 180° C. under stirring at 180 rpm for 1 hour. After the reaction, 15 ml of distillate of toluene and water was removed.

After cooling the mixture in the air, 35.31 g (120 mmol) of 3,4,3',4'-biphenyltetracarboxyiic dianhydride, 24.02 g (120 mmol) of 3,4'-diaminodiphenyl ether, 17.54 g (60 mmol) of bis-(3-aminophenoxy)-1,3-benzene, 213 g of N-methylpyrrolidone and 30 g of toluene were added and the mixture was stirred at room temperature for 1 hour.

The mixture was then heated at 180° C. under stirring at 180 rpm for 3 hours and 15 minutes. The mixture is then heated at 180° C. under stirring at 100 rpm for 1 hour. The polyimide solution after removing the reaction reflux had a concentration of polyimide of 20%.

The thus produced polyimide block copolymer had a most frequent molecular weight M of 90,400, number average molecular weight Mn of 47,300, weight average molecular weight Mw of 100,000, Z average molecular weight Mz of 172,300, the molecular weights being in terms of polystyrene. Mw/Mn=2.10, Mz/Mw=3.64.

Preparation of Coating Composition for Electrodeposition

To 150 g (polyimide block copolymer content: 30 g) of the thus prepared 20% polyimide block copolymer solution (acid equivalent: 1786), 200 g of γ-butyrolactone, 3.4 g of N-methylmorpholine (ratio to amount necessary for neutralization: 200%), 50 g of cyclohexanone, 100 g of anisole, and 9 g of NT-200 (30% by weight based on the polyimide block copolymer) as a photoacid generator were added and dissolved.

To this solution, 185 ml of ion-exchanged water was added to prepare a colloidal dispersion (the content of the polyimide block copolymer was 4.3% by weight). The preparation of the solution for electrodeposition was carried out in a dark room.

Electrodeposition Experiment

In a beaker, 200 ml of the above-described aqueous solution for electrolysis was placed and a copper plate as a cathode and a metal plate to be coated having a size of 2 cm×8 cm (copper foil for printed circuit board manufactured by MITSUI KINZOKU KOZAN) as an anode were immersed therein, followed by flowing electric current therebetween, thereby carrying out electrodeposition experiment.

The temperature of the solution was 29° C., the distance between the electrodes was 35 mm, the voltage was 15V and the quantity of electricity was 0.8 coulombs. After completion of energizing, the copper foil coated by electrodeposition was heated to dry for 10 minutes with an infrared drier set at a temperature of 90° C. After this series of treatment, the thickness of the polyimide block copolymer coating on the front surface was 11 µm.

Method for Forming Images

On this photoresist coating layer, a test pattern (through holes and line-and-space pattern having diameters and widths of 10, 15, 20, 25, - - -, and 200 µm, respectively) for positive-type photomask was placed, and the coating layer was irradiated at a dose of exposure of 1000 mJ at which images are obtained using 2 kW extra-high pressure mercury lamp apparatus (JP-2000G, commercial product of Oak Seisakusho).

The coated material after the above-mentioned irradiation was immersed in a developer kept at room temperature. The developer was a mixture of 30 g of aminoethanol, 30 g of N-methylpyrrolidone and 30 g of water.

After immersing the coating layer after the above-mentioned irradiation in this solution for 8 minutes, the resultant was washed with deionized water and dried with an infrared lamp, followed by observation of the resolution.

As for the through hole patterns in the coating membrane after the above-mentioned treatments, formation of through holes having sharp and circular sections having a diameter of 15 µm was confirmed. As for the line-and-space pattern, formation of images of lines having a width of 15 µm was confirmed. The adhesiveness with the copper foil was good.

Example 3

In the same manner as in Example 1, a solution of polyimide block copolymer with a concentration of 20% was prepared.

Preparation of Polyimide Block Copolymer Solution

To the flask, 29.78 g (120 mmol) of bicyclo(2,2,2)-oct-7-ene-2,3,5,6-tetracarboxylic dianhydride, 9.12 g (60 mmol) of 3,5-diaminobenzoic acid, 1.8 g (18 mmol) of γ-valerolactone, 1.4 g (36 mmol) of pyridine, 150 g of N-methylpyrrolidone and 30 g of toluene were added, and the mixture was heated at a silicone bath temperature of 180° C. under stirring at 180 rpm for 1 hour. After the reaction, 15 ml of distillate of toluene and water was removed.

After cooling the mixture in the air, 17.65 g (60 mmol) of 3,4,3',4'-biphenyltetracarboxylic dianhydride, 13.01 g (65 mmol) of 3,4'-diaminodiphenyl ether, 17.54 g (60 mmol) of bis-(3-aminophenoxy)-1,4-benzene, 152 g of N-methylpyrrolidone and 30 g of toluene were added and the mixture was stirred at room temperature for 30 minutes. Then 1.00 g (10.2 mmol) of maleic anhydride and 20 g of N-methylpyrrolidone were added and the mixture was stirred at room temperature for another 1 hour.

The mixture was then heated at 180° C. under stirring at 180 rpm for 2 hours and 30 minutes. The polyimide solution after removing the reaction reflux had a concentration of polyimide of 20%.

The thus produced polyimide block copolymer had a most frequent molecular weight M of 38,100, number average molecular weight Mn of 20,700, weight average molecular weight Mw of 42,800, Z average molecular weight Mz of 75,900, the molecular weights being in terms of polystyrene. Mw/Mn=2.06, Mz/Mw=3.66.

Preparation of Coating Composition for Electrodeposition

To 150 g (polyimide block copolymer content: 30 g) of the thus prepared 20% polyimide block copolymer solution (acid equivalent: 1327), 200 g of γ-butyrolactone, 4.6 g of N-methylmorpholine, 30 g of cyclohexanone, 100 g of anisole, and 9 g of NT-200 as a photoacid generator were added and dissolved.

To this solution, 185 ml of ion-exchanged water was added to prepare a colloidal dispersion (the content of the polyimide block copolymer was 4.3% by weight). The preparation of the solution for electrodeposition was carried out in a dark room.

Electrodeposition Experiment

In a beaker, 200 ml of the above-described aqueous solution for electrolysis was placed and a copper plate as a cathode and a metal plate to be coated having a size of 2 cm×8 cm as an anode were immersed therein, followed by flowing electric current therebetween, thereby carrying out electrodeposition experiment.

The temperature of the solution was 29° C., the distance between the electrodes was 35 mm, the voltage was 15V, duration of energizing was 2 minutes and the quantity of electricity was 1.0 coulombs. After completion of energizing, the copper foil coated by electrodeposition was heated to dry for 10 minutes with a reduced pressure drier set at a temperature of 90° C. After this series of treatment, the thickness of the polyimide block copolymer coating on the front surface was 10 µm.

Method for Forming Images

On this photoresist coating layer, a test pattern for positive-type photomask was placed, and the coating layer was irradiated at a dose of exposure of 1000 mJ at which images are obtained using 2 kW extra-high pressure mercury lamp apparatus.

The coated material after the above-mentioned irradiation was immersed in a developer kept at room temperature. The developer was a mixture of 30 g of aminoethanol, 30 g of N-methylpyrrolidone and 30 g of water.

After immersing the coating layer after the above-mentioned irradiation in this solution for 7 minutes, the resultant was washed with deionized water and dried with an infrared lamp, followed by observation of the resolution.

As for the through hole patterns in the coating membrane after the above-mentioned treatments, formation of through holes having sharp and circular sections having a diameter of 15 µm was confirmed. As for the line-and-space pattern, formation of images of lines having a width of 15 µm was confirmed. The adhesiveness with the copper foil was good.

Example 4

In the same manner as in Example 1, a solution of polyimide block copolymer with a concentration of 18% was prepared.

Preparation of Polyimide Block Copolymer Solution

To the flask, 64.44 g (200 mmol) of 3,4,3',4'-benzophenonetetracarboxylic dianhydride, 12.22 g (100 mmol) of 2,4-diaminotoluene, 3.0 g (30 mmol) of γ-valerolactone, 4.8 g (60 mmol) of pyridine, 300 g of N-methylpyrrolidone and 50 g of toluene were added, and the mixture was stirred at 180 rpm for 0.5 hour at room temperature under nitrogen atmosphere. The mixture was then heated to 180° C. and stirred at 180 rpm for 1 hour. In the reaction, toluene-water azeotrope was removed.

After cooling the mixture in the air, 29.42 g (100 mmol) of 3,4,3',4'-biphenyltetracarboxylic dianhydride, 15.22 g (100 mmol) of 3,5-diaminobenzoic acid, 43.35 g (105.6 mmol) of 2,2-bis{4-(4-aminophenoxy)phenyl}propane; 300 g of N-methylpyrrolidone and 80 g of toluene were added and the mixture was stirred at room temperature for 30 minutes. Then 1.09 g (11.1 mmol) of maleic anrhydride and 18 g of N-methylpyrrolidone were added and the mixture was stirred at room temperature for another 0.5 hour.

The mixture was then heated at 180° C. under stirring at 180 rpm for 4 hours and 30 minutes. After cooling the mixture to room temperature, 87 g of N-methylpyrrolidone was added. The polyimide solution had a concentration of polyimide of 18%.

The thus produced polyimide block copolymer had a most frequent molecular weight M of 44,200, number average molecular weight Mn of 28,600, weight average molecular weight Mw of 58,900, Z average molecular weight Mz of 111,800, the molecular weights being in terms of polystyrene. Mw/Mn=2.06, Mz/Mw=3.91.

Preparation of Coating Composition for Electrodeposition

To 150 g (polyimide block copolymer content: 27 g) of the thus prepared 18% polyimide block copolymer solution (acid equivalent: 823), 200 g of γ-butyrolactone, 3.6 g of N-methylmorpholine, 50 g of cyclohexanone, 100 g of anisole, and 8.1 g of NT-200 as a photoacid generator were added and dissolved.

To this solution, 200 ml of ion-exchanged water was added to prepare a colloidal dispersion (the content of the polyimide block copolymer was 3.8% by weight). The preparation of the solution for electrodeposition was carried out in a dark room.

Electrodeposition Experiment

In a beaker, 200 ml of the above-described aqueous solution for electrolysis was placed and a copper plate as a cathode and a copper foil to be coated having a size of 2 cm×8 cm and a thickness of 25 μm as an anode were immersed therein, followed by flowing electric current therebetween, thereby carrying out electrodeposition experiment.

The temperature of the solution was 29° C., the distance between the electrodes was 35 mm, the voltage was 15V, duration of energizing was 2 minutes and the quantity of electricity was 0.9 coulombs. After completion of energizing, the copper foil coated by electrodeposition was heated to dry for 10 minutes with a reduced pressure drier set at a temperature of 90° C.

Method for Forming Images

On this photoresist coating layer, a test pattern for positive-type photomask was placed, and the coating layer was irradiated at a dose of exposure of 1000 mJ at which images are obtained using 2 kW extra-high pressure mercury lamp apparatus.

The coated material after the above-mentioned irradiation was immersed in a developer kept at room temperature. The developer was a mixture of 30 g of aminoethanol, 30 g of N-methylpyrrolidone and 30 g of water.

After immersing the coating layer after the above-mentioned irradiation in this solution for 27 minutes, the resultant was washed with deionized water and dried with an infrared lamp, followed by observation of the resolution. The copper foil was then further heated at 150° C. for 30 minutes.

As for the through hole patterns in the coating membrane after the above-mentioned treatments, the pattern had a thickness of 10 μm and formation of through holes having sharp and circular sections having a diameter of 15 μm was confirmed. As for the line-and-space pattern, formation of images of lines having a width of 15 μm was confirmed. The adhesiveness with the copper foil was good.

What is claimed is:

1. A method for electrodeposition of polyimides comprising:

immersing an electric conductor in a composition comprising a photoacid generator, a positive-type photosensitive polyimide having oxycarbonyl groups in side chains, a polar solvent which dissolves said polyimide, water, a dispersing agent, and an alkaline neutralizer, and supplying electric current through said electric conductor to deposit a polyimide membrane on said electric conductor which is an anode.

2. A method for producing a patterned electro-deposited polyimide membrane, comprising irradiating said polyimide membrane electro-deposited by the method according to claim 1 with a light through a mask pattern, and forming a positive image by development with an alkali.

3. The method according to claim 2, wherein said development with an alkali is carried out by using a developing solution containing aminoethanol.

4. The method of claim 1, wherein said photoacid generator is at least one selected from the group consisting of esters of naphthoquinone diazide sulfonic acid with trihydroxybenzophenone, trihydroxybenzene, or 2-, or 4-methylphenol; N-phenyl-aminophenyldiazonium salts and triphenylsulfonium salts.

5. The method of claim 1, wherein the positive-type photosensitive polyimide having oxycarbonyl groups in side chains is diaminobenzoic acid.

* * * * *